(12) United States Patent
Allen et al.

(10) Patent No.: US 12,055,996 B2
(45) Date of Patent: Aug. 6, 2024

(54) STORAGE DEVICE WRITE-READ ERROR REDUCTION SYSTEM

(71) Applicant: Dell Products L.P., Round Rock, TX (US)

(72) Inventors: Gregory Martin Allen, Layton, UT (US); Anthony Gerard Ginty, Cork (IE); Frank Widjaja Yu, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 66 days.

(21) Appl. No.: 17/973,292

(22) Filed: Oct. 25, 2022

(65) Prior Publication Data

US 2024/0134727 A1 Apr. 25, 2024
US 2024/0231976 A9 Jul. 11, 2024

(51) Int. Cl.
*G06F 11/00* (2006.01)
*G06F 3/06* (2006.01)

(52) U.S. Cl.
CPC .......... *G06F 11/004* (2013.01); *G06F 3/0619* (2013.01); *G06F 3/0653* (2013.01); *G06F 3/0679* (2013.01); *G06F 11/008* (2013.01); *G06F 2201/805* (2013.01)

(58) Field of Classification Search
CPC ..... G06F 2212/7211; G06F 2212/7205; G06F 3/0652; G06F 3/0619; G06F 3/0653; G06F 3/0679; G06F 12/0253; G06F 11/004; G06F 11/008; G11C 16/349; G11C 16/3495; G11C 16/3418; G11C 16/3422; G11C 16/3427; G11C 16/3431
See application file for complete search history.

(56) References Cited

U.S. PATENT DOCUMENTS

| | | | |
|---|---|---|---|
| 9,152,568 B1 | 10/2015 | Seigler et al. | |
| 10,579,468 B2 | 3/2020 | Muchherla et al. | |
| 2017/0123973 A1* | 5/2017 | Kim | G06F 12/0253 |
| 2017/0257940 A1* | 9/2017 | Stoev | G11C 16/349 |
| 2017/0262198 A1* | 9/2017 | Nakata | G11C 16/10 |
| 2018/0293029 A1* | 10/2018 | Achtenberg | G11C 29/028 |
| 2020/0098421 A1* | 3/2020 | Alsasua | G11C 16/3418 |
| 2023/0400993 A1* | 12/2023 | Zhou | G06F 3/0683 |

* cited by examiner

*Primary Examiner* — Curtis James Kortman
(74) *Attorney, Agent, or Firm* — Joseph Mencher

(57) ABSTRACT

A storage device write-read error reduction system includes a computing device that includes a storage device. The storage device determines, at a temperature that is within a predefined temperature range, that a storage device background operation should be performed and, in response, identifies data that is stored in the storage device and that was written to the storage device outside the predefined temperature range. The storage device then prioritizes the data that was written to the storage device outside the predefined temperature range over data that was written to the storage device within the predefined temperature range and, based on that prioritization, performs the storage device background operation to rewrite the data to the storage device.

20 Claims, 14 Drawing Sheets

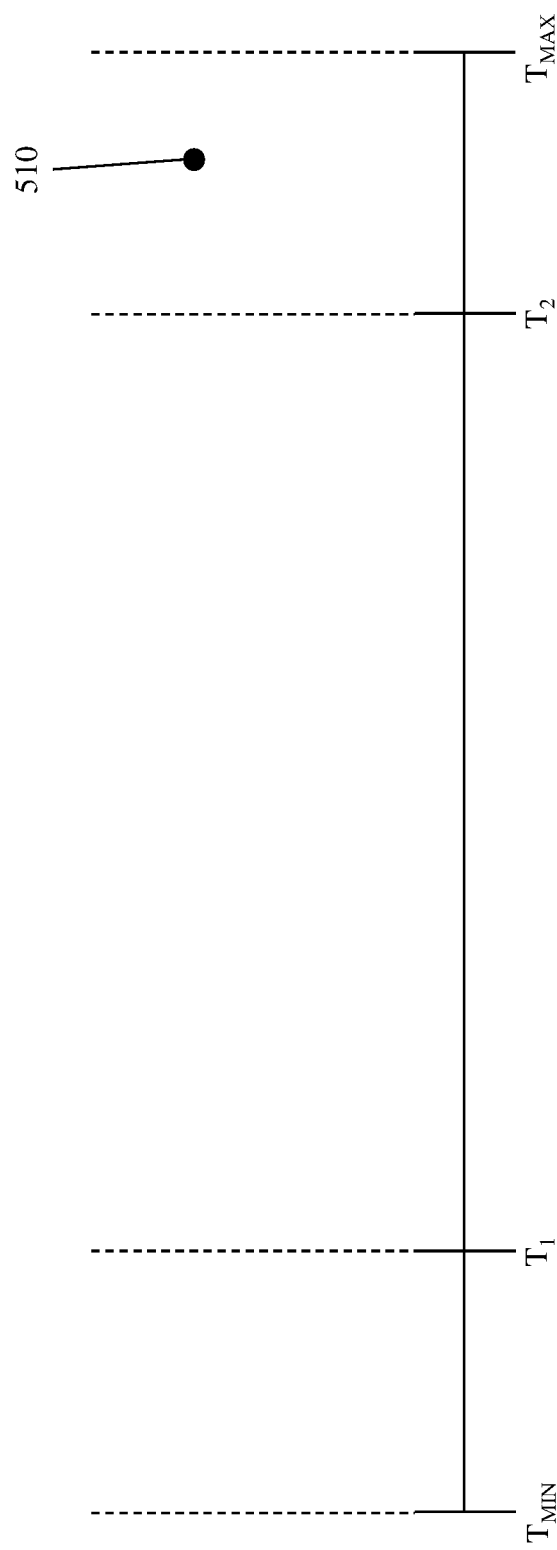

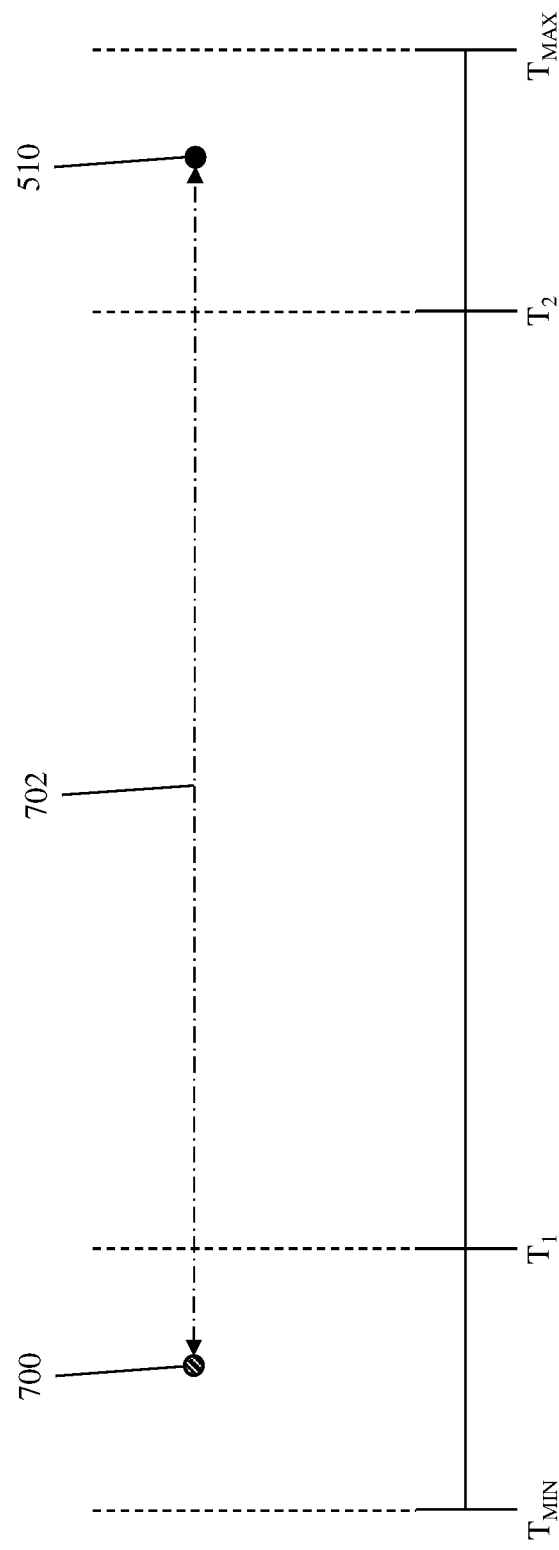

STORAGE DEVICE WRITE-READ ERROR REDUCTION SYSTEM

BACKGROUND

The present disclosure relates generally to information handling systems, and more particularly to reducing write-read errors in a storage device in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as server devices, desktop computing devices, laptop/notebook computing devices, tablet computing devices, mobiles phones, and/or other computing devices known in the art include storage devices such as, for example, Solid State Drive (SSD) storage devices that are utilized to store data for those computing devices. While in many situations, the computing devices discussed above are utilized in temperature-controlled environment such as datacenters, in some situations the computing devices discussed above may be required to operate in relatively extreme temperature environments. Furthermore, the writing of data to storage devices in a computing device and the reading of that data back from those storage devices in extreme temperature environments can result in issues.

For example, computing devices utilized in telecommunications (Telco) applications (e.g., $5^{th}$ generation (5G) Telco applications), "edge" environments (computing and storage of data close to where the data is produced and away from a traditional data center), Outside Plant (OSP) Systems and/or other "fresh air" compute applications known in the art may be located in regions where the temperatures can vary widely (e.g., GR-3108 class 2 storage device ambient temperature ranges between −40 C to 65 C). Furthermore, Solid State Drive (SSD) storage devices tend to be designed to operate in relatively narrow ambient temperature ranges (e.g., 10-35 C), and can experience issues when data is written and then read back over a relatively large temperature ranges (sometimes referred to as "cross-temperature" issues). For example, the writing of data to an SSD storage device at a relatively extreme hot temperature and the subsequent reading of that data back from the SSD storage device at a relatively extreme cold temperature (or vice versa) can result in errors in the data that is read (e.g., due to voltage thresholds in the NAND memory cells changing at the different extreme temperatures), sometimes resulting in uncorrectable errors and, in some cases, data loss. Conventional solutions to such issues include configuring storage devices to operate over relatively larger temperature ranges (typically by sacrificing storage device endurance) or providing heaters for the storage device, both which increase costs.

Accordingly, it would be desirable to provide a storage device write-read error reduction system that addresses the issues discussed above.

SUMMARY

According to one embodiment, an Information Handling System (IHS) includes a storage processing system; and a storage device subsystem that is coupled to the storage device processing system and that includes instructions that, when executed by the processing system, cause the storage processing system to provide a storage device write-read error reduction system that is configured to: determine, at a first temperature that is within a predefined temperature range, that a storage device background operation should be performed; identify, in response to determining that the storage device background operation should be performed, first data that is stored in the storage device and that was written to the storage device outside the predefined temperature range; prioritize, based on the first data having been written to the storage device outside the predefined temperature range, the first data for rewriting during storage device background operations over second data that is stored in the storage device and that was written to the storage device within the predefined temperature range; and perform, based on the prioritizing the first data over the second data, the storage device background operation to rewrite the first data to the storage subsystem.

BRIEF DESCRIPTION OF THE DRAWINGS

FIG. 5D is a graph view illustrating an embodiment of a write operation performed at an extreme temperature by the storage device of FIG. 3 during the method of FIG. 4.

FIG. 7 is a graph view illustrating an embodiment of conventional write-read operations performed by a storage device.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
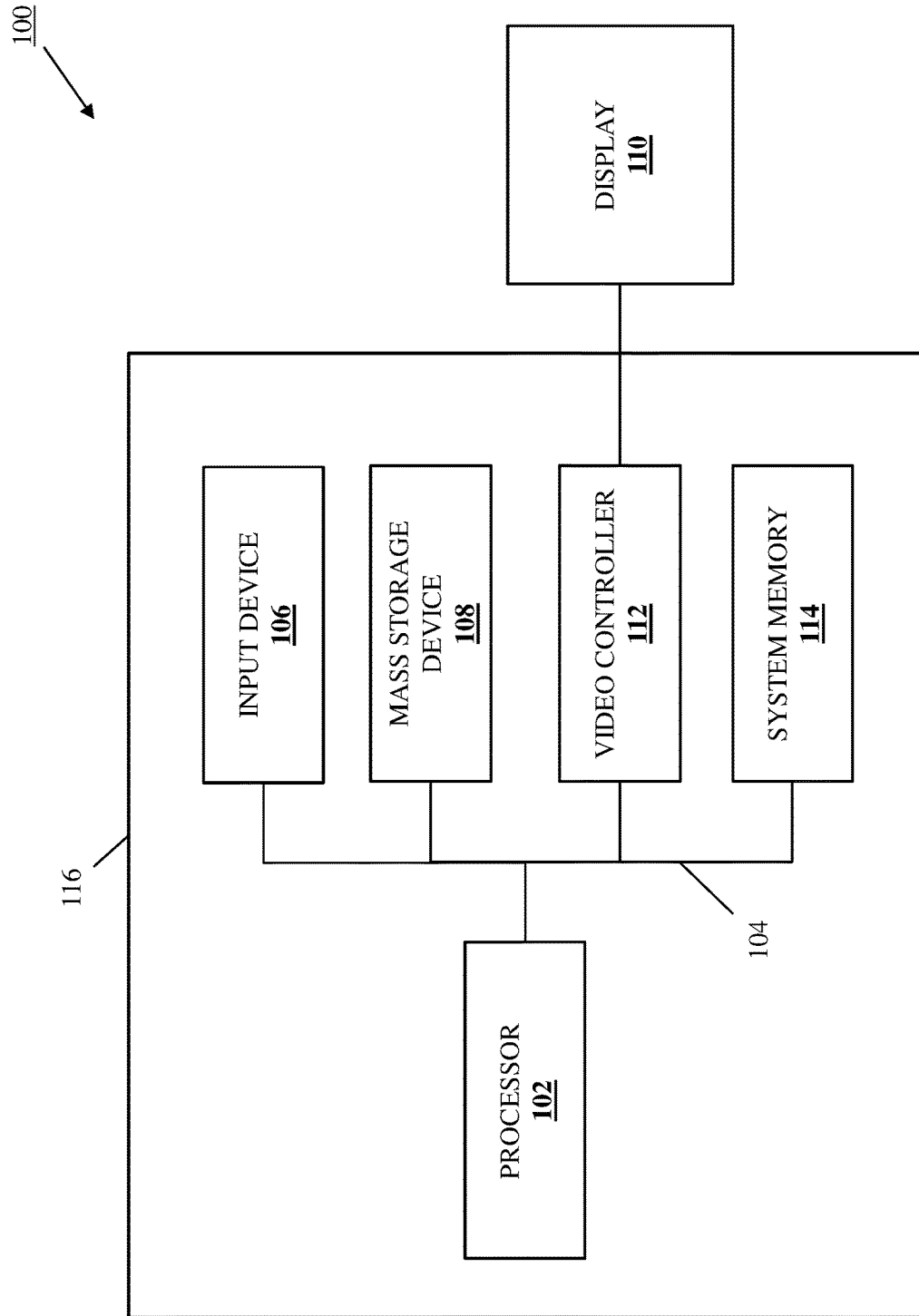
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
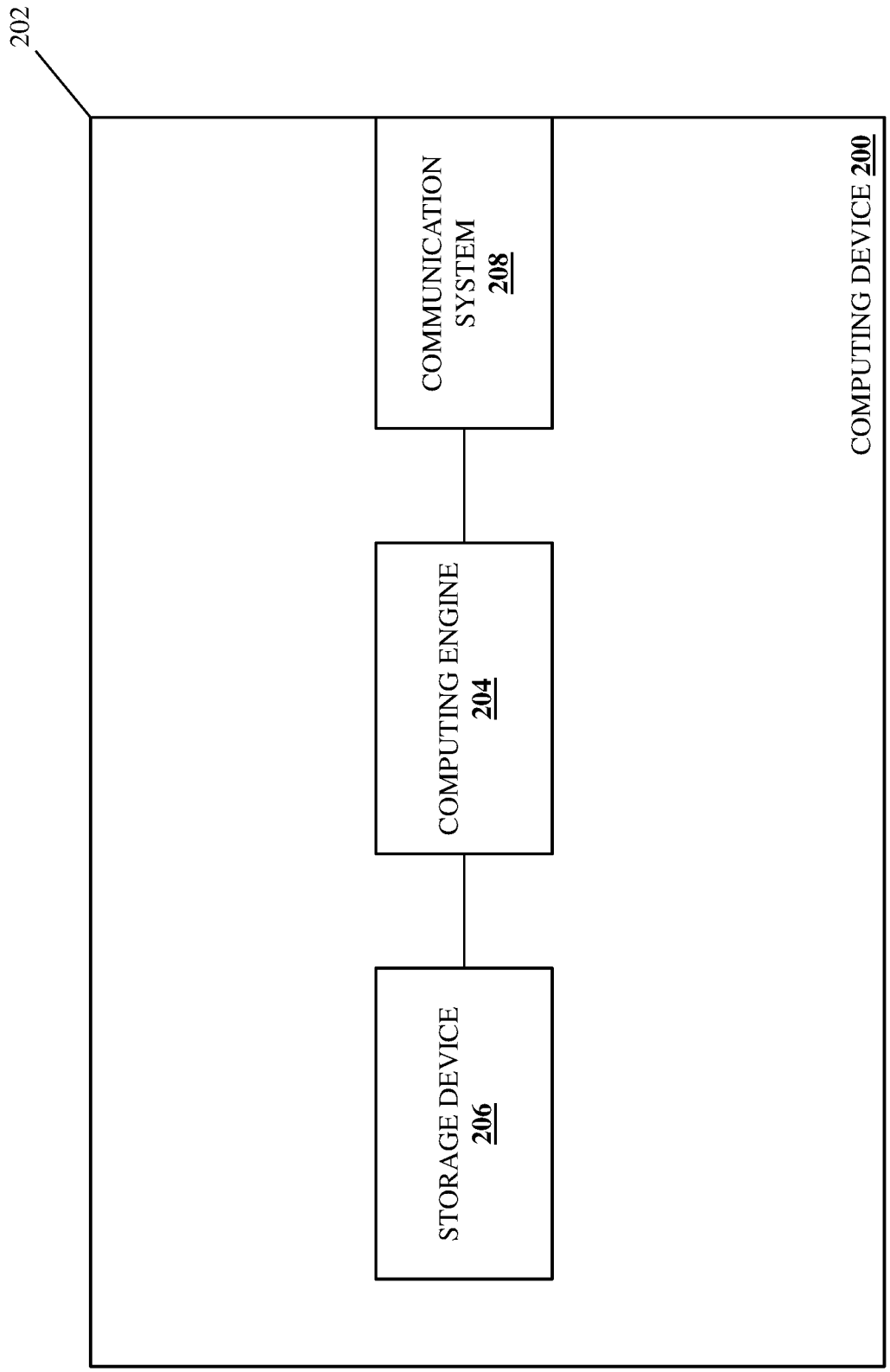
FIG. 2 is a schematic view illustrating an embodiment of a computing device that may include a storage device write-read error reduction system provided according to the teachings of the present disclosure.

Referring now to FIG. 2, an embodiment of a computing device 200 is illustrated that may include storage devices utilizing the storage device write-read error reduction system of the present disclosure. In an embodiment, the computing device 200 may be provided by the IHS 100 discussed above with reference to FIG. 1, and/or may include some or all of the components of the IHS 100, and in a specific example may be provided by a server device. However, while illustrated and discussed as being provided by a server device, one of skill in the art in possession of the present disclosure will recognize that the functionality of the computing device 200 discussed below may be provided by other devices (e.g., networking devices (e.g., switch devices), storage systems, desktop computing devices, laptop computing devices, table computing devices, mobile phones, etc.) that are configured to operate similarly as computing device 200 discussed below. In the illustrated embodiment, the computing device 200 includes a chassis 202 that houses the components of the computing device 200, only some of which are illustrated and discussed below. For example, the chassis 202 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a computing engine 204 that is configured to perform the functionality of the computing engines and/or computing devices discussed below.

The chassis 202 may also house a storage device 206 that is coupled to the computing engine 204 (e.g., via a coupling between the storage device 206 and the processing system) and that may include the storage device write-read error reduction system of the present disclosure. In an embodiment, the storage device 206 may be provided in the IHS 100 discussed above with reference to FIG. 1 (e.g., as the storage device 108), and in a specific example may be provided by a Solid-State Drive (SSD) storage device such as a Non-Volatile Memory express (NVMe) SSD storage device. However, while described as being provided by a particular storage device using particular storage technology, one of skill in the art in possession of the present disclosure will appreciate how the teachings of the present disclosure may be applied to other types of storage devices and/or storage technologies while remaining within the scope of the present disclosure as well. Furthermore, while illustrated and described as being included in the chassis 202 of the computing device, the storage device 206 may be provided by an "external" storage device that is located outside of the chassis 202 and separate from the computing device 200 while remaining within the scope of the present disclosure as well.

The chassis 202 may also house a communication system 208 that is coupled to the computing engine 204 (e.g., via a coupling between the communication system 208 and the processing system) and that may be provided by a Network Interface Controller (NIC), wireless communication systems (e.g., BLUETOOTH®, Near Field Communication (NFC) components, WiFi components, etc.), and/or any other communication components that would be apparent to one of skill in the art in possession of the present disclosure. However, while a specific computing device 200 has been illustrated and described, one of skill in the art in possession of the present disclosure will recognize that computing devices (or other devices operating according to the teachings of the present disclosure in a manner similar to that described below for the computing device 200) may include a variety of components and/or component configurations for providing conventional computing device functionality, as well as the functionality discussed below, while remaining within the scope of the present disclosure as well.

Figure 3:
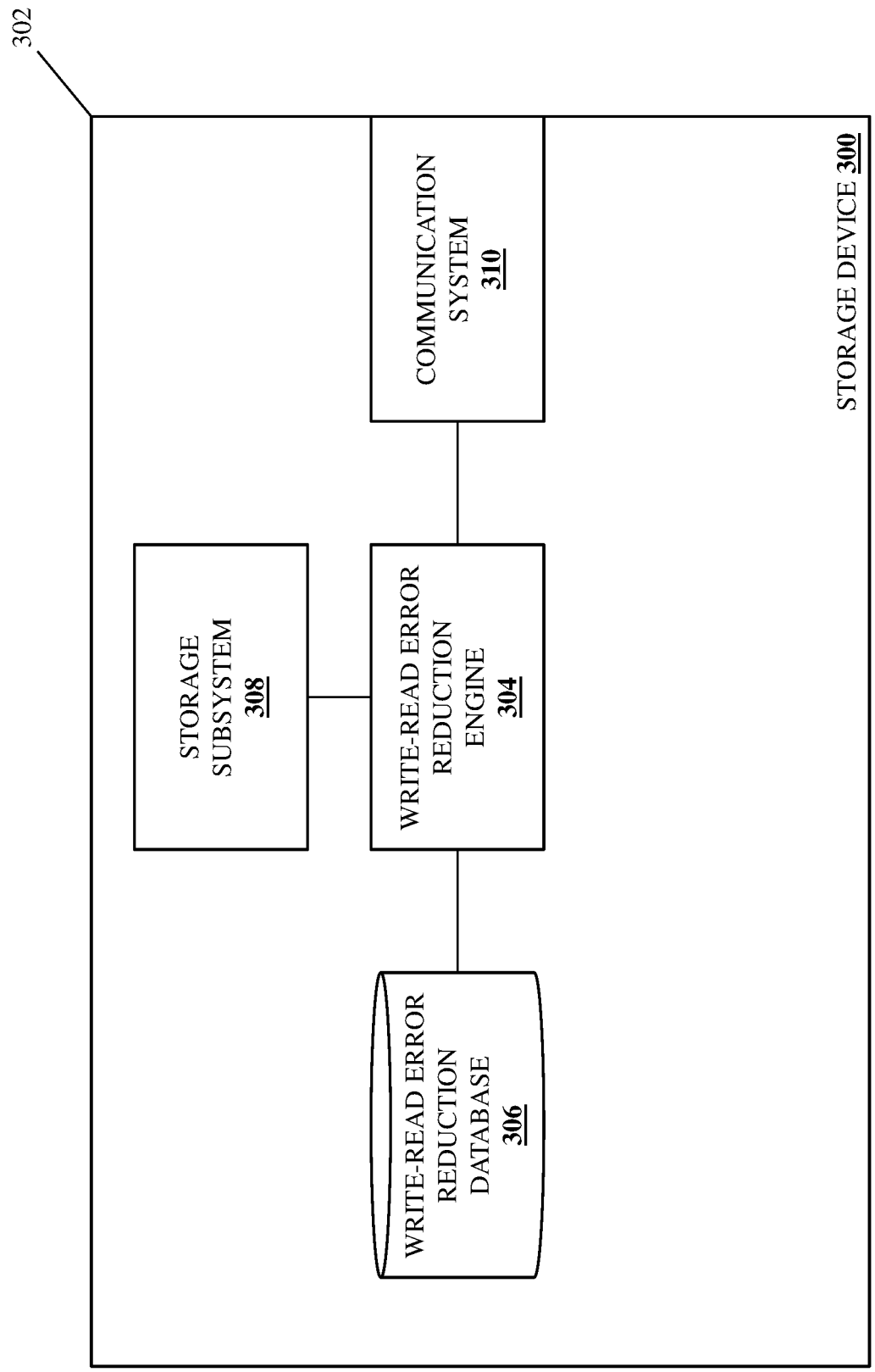
FIG. 3 is a schematic view illustrating an embodiment of a storage device that may provide the storage device write-read error reduction system according to the teachings of the present disclosure.

Referring now to FIG. 3, an embodiment of a storage device 300 is illustrated that may provide the storage device 206 discussed above with reference to FIG. 2. As such, the storage device 300 may be provided in the IHS 100 discussed above with reference to FIG. 1 (e.g., as the storage device 108), and in specific examples may be provided by an SSD storage device such as a NVMe SSD storage device. However, while illustrated and discussed as being provided by particular storage devices using particular storage technologies, one of skill in the art in possession of the present disclosure will recognize that the storage device 300 discussed below may be provided by different types of storage devices utilizing other types of storage technology while remaining within the scope of the present disclosure as well. In the illustrated embodiment, the storage device 300 includes a chassis 302 that houses the components of the storage device 300, only some of which are illustrated and discussed below. For example, the chassis 302 may house a processing system (not illustrated, but which may include a processor similar to the processor 102 discussed above with reference to FIG. 1) and a memory system (not illustrated, but which may include a memory similar to the memory 114 discussed above with reference to FIG. 1) that is coupled to the processing system and that includes instructions that, when executed by the processing system, cause the processing system to provide a write-read error reduction engine 304 that is configured to perform the functionality of the write-read error reduction engines and/or storage devices discussed below.

The chassis 302 may also house a storage system that is coupled to the write-read error reduction engine 304 (e.g., via a coupling between the storage system and the processing system) and that includes a write-read error reduction database 306 that is configured to store any of the information utilized by the write-read error reduction engine 304 discussed below. The chassis 302 may also house a storage subsystem 308 that is coupled to the write-read error reduction engine 304 (e.g., via a coupling between the storage subsystem 308 and the processing system) and that, in a specific example, may be provided by NAND storage elements. However, while described as being provided using particular storage technologies, one of skill in the art in possession of the present disclosure will appreciate that the storage subsystem 308 may be provided using other storage technologies while remaining within the scope of the present disclosure as well.

The chassis 302 may also house a communication system 310 that is coupled to the write-read error reduction engine 304 (e.g., via a coupling between the communication system 310 and the processing system) and that may be provided by any of a variety of storage communication components that would be apparent to one of skill in the art in possession of the present disclosure. However, while a specific storage device 300 has been illustrated and described, one of skill in the art in possession of the present disclosure will recognize that storage devices (or other devices operating according to the teachings of the present disclosure in a manner similar to that described below for the storage device 300) may include a variety of components and/or component configurations for providing conventional storage device functionality, as well as the functionality discussed below, while remaining within the scope of the present disclosure as well.

Figure 4:
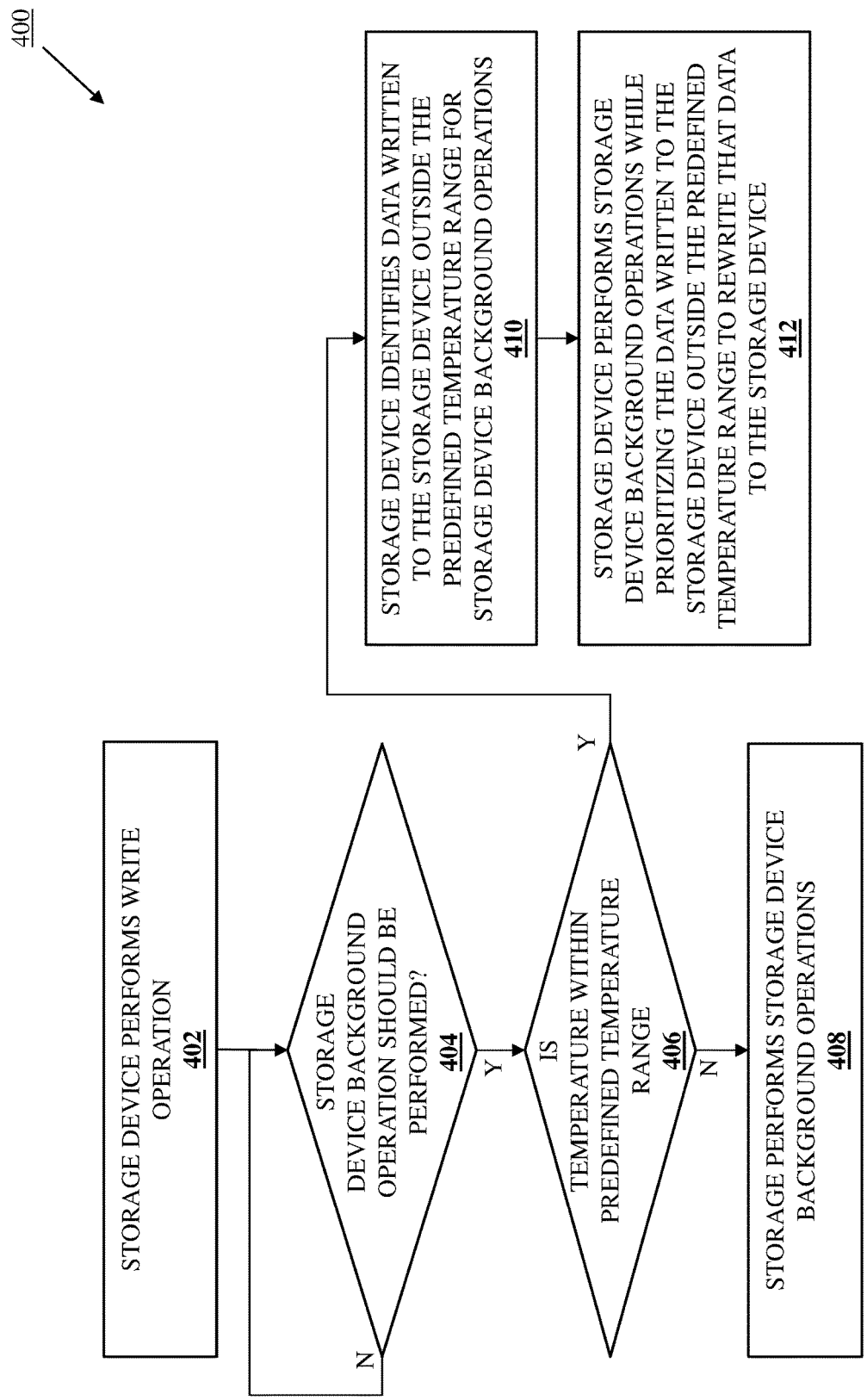
FIG. 4 is a flow chart illustrating an embodiment of a method for reducing write-read errors in a storage device.

Referring now to FIG. 4, an embodiment of a method 400 for reducing read-write errors in a storage device is illustrated. As discussed below, the systems and methods of the present disclosure provide for the prioritization of data, which was originally written to a storage subsystem while the storage subsystem was at a temperature that was outside of a predetermined temperature range, for use in background operations that rewrite that data to the storage subsystem while the storage subsystem is at a temperature that is within the predetermined temperature range. For example, the storage device write-read error reduction system of the present disclosure may include a computing device that includes a storage device. The storage device determines, at a temperature that is within a predefined temperature range, that a storage device background operation should be performed and, in response, identifies data that is stored in the storage device and that was written to the storage device outside the predefined temperature range. The storage device then prioritizes the data that was written to the storage device outside the predefined temperature range over data that was written to the storage device within the predefined temperature range and, based on that prioritization, performs the storage device background operation to rewrite the data to the storage device. As will be appreciated by one of skill in the art in possession of the present disclosure, the systems and methods described herein operate to reduce read-write errors in storage devices that may otherwise result when a relatively large temperature difference exists between the temperature at which the data is written to a storage subsystem and the temperature at which the data is subsequently read from that storage subsystem.

Figure 5A:
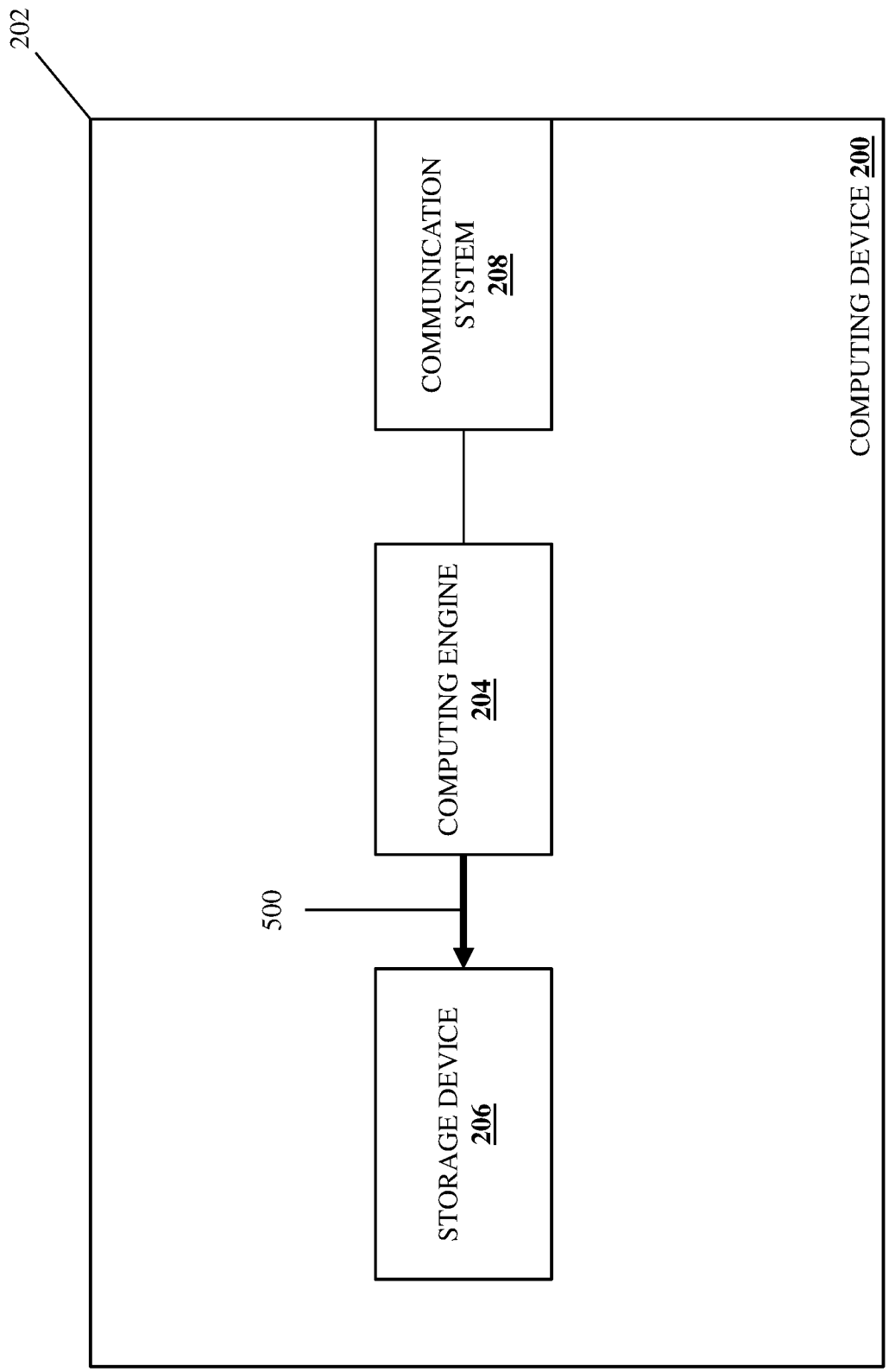
FIG. 5A is a schematic view illustrating an embodiment of the computing device of FIG. 2 operating during the method of FIG. 4.
Figure 5B:
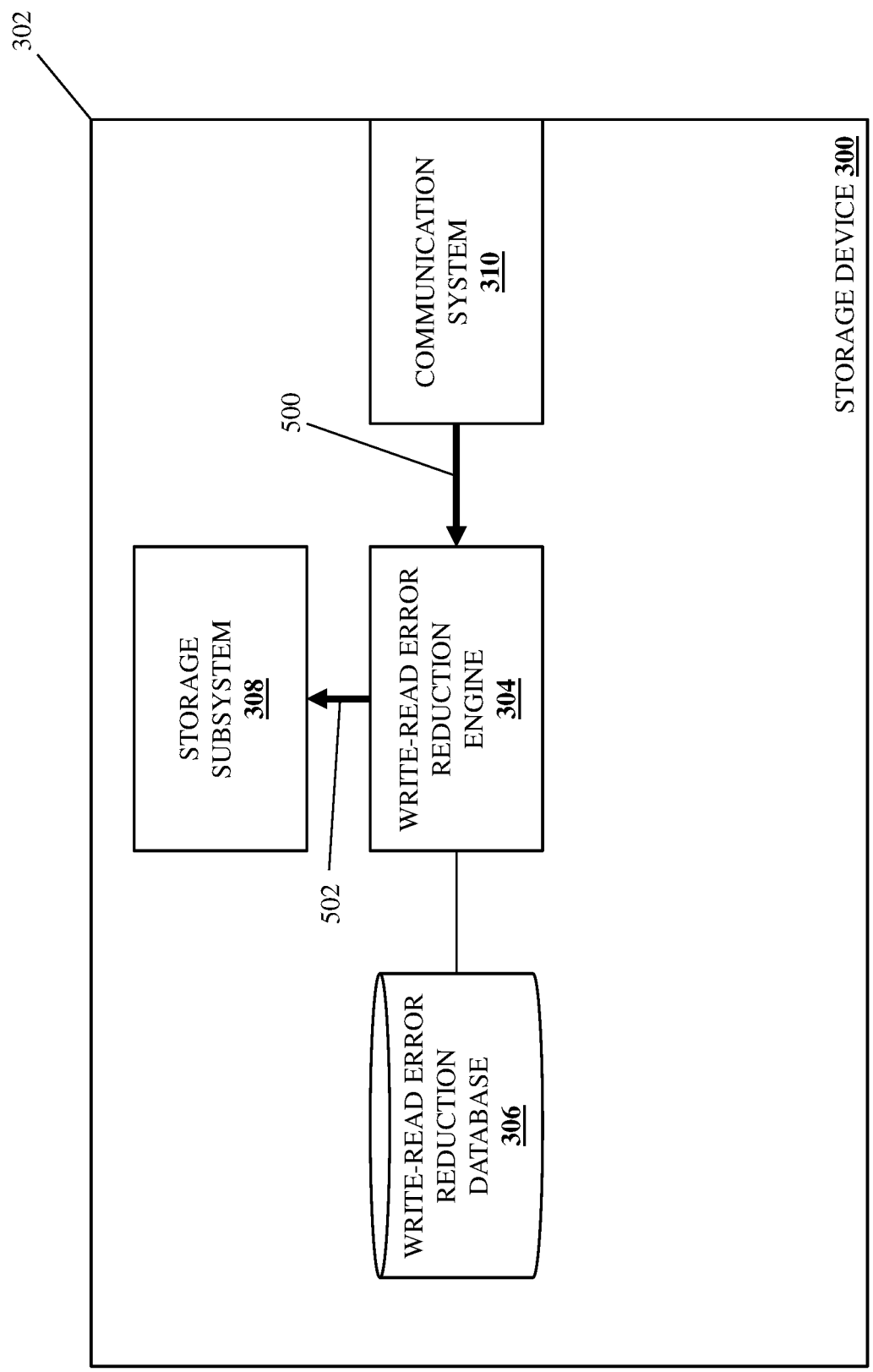
FIG. 5B is a schematic view illustrating an embodiment of the storage device of FIG. 3 operating during the method of FIG. 4.

The method 400 begins at block 402 where a storage device performs a write operation. With reference to FIGS. 5A and 5B, in an embodiment of block 402, the computing engine 204 in the computing device 200 may perform write instruction operations 500 that may include providing a write instruction to the storage device 206/300, and the write-read error reduction engine 304 in the storage device 300 receiving that write instruction via its communications system 310. In response to receiving the write instruction, the write-read error reduction engine 304 may then perform write operations 502 that may include writing data to the storage subsystem 308 in the storage device 206/300. As will be appreciated by one of skill in the art in possession of the present disclosure, the writing of the data as part of the write operations 502 may be defined by the write instruction received from the computing engine 204. However, while the write operations 502 are illustrated and described as being performed in response to write instructions received from the computing device 200, write operations may be performed in response to write instructions received from other entities, or generated internally by one or more subsystems in the storage device 300 (e.g., as part of background operations in the storage device 206/300), while remaining within the scope of the present disclosure as well.

Figure 5C:
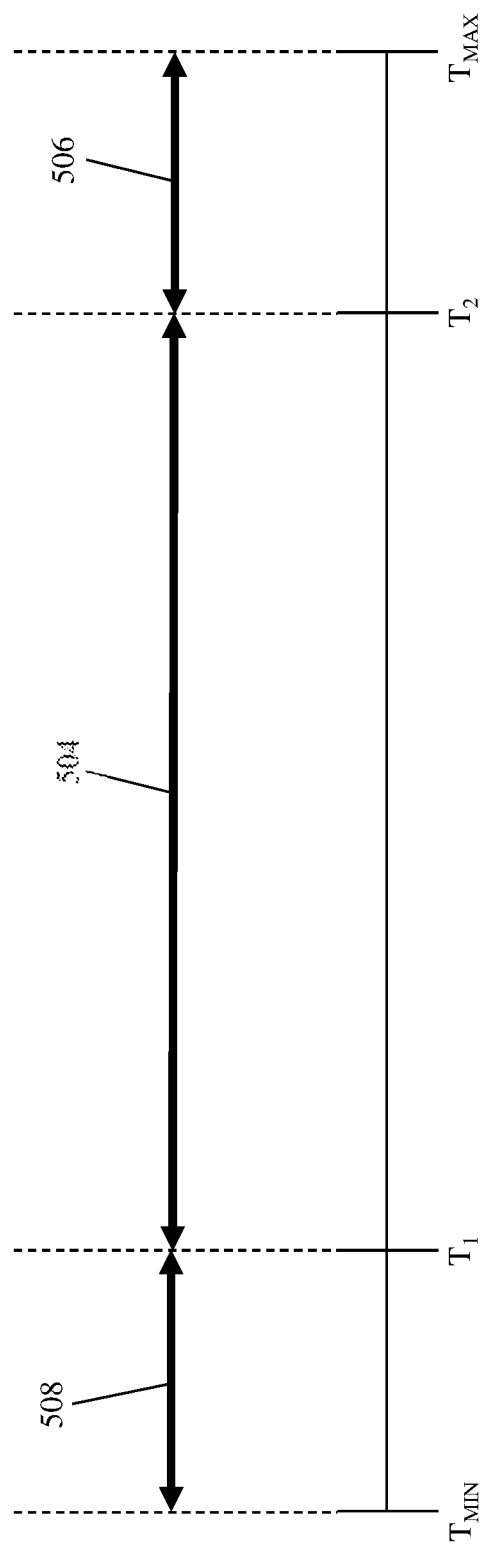
FIG. 5C is a graph view illustrating an embodiment of available temperatures for write operations performed by the storage device of FIG. 3 during the method of FIG. 4.

As discussed above, write operations in a storage device may occur at any of a variety of temperatures. For example, FIG. 5C illustrates an embodiment of a temperature graph that includes a lowest temperature $T_{MIN}$ that may be experienced by a storage device, and a highest temperature $T_{MAX}$ that may be experienced by a storage device. The systems and methods of the present disclosure may define a predefined temperature range 504 that is illustrated and described below as being provided between a first temperature $T_1$ that is higher than the lowest temperature $T_{MIN}$ that may be experienced by a storage device, and a second temperature $T_2$ that is higher than the first temperature $T_1$ but lower than the highest temperature $T_{MAX}$ that may be experienced by the storage device. In some embodiments, the temperature range 506 between the second temperature $T_2$ and the highest temperature $T_{MAX}$ that may be experienced by a storage device may be considered an "extreme hot" or otherwise relatively high temperature (e.g. a temperature range of the storage device between 50 C and 85 C), while the temperature range 508 between the first temperature $T_1$ and the lowest temperature $T_{MIN}$ that may be experienced by a storage device may be considered an "extreme cold" or relatively low temperature (e.g. a temperature range of the storage device between 0 C and −40 C) such that the temperature range 504 provides relatively nominal temperatures (a temperature range of the storage device between a range of 0 C to 50 C).

As will be appreciated by one of skill in the art in possession of the present disclosure, either of the "extreme" temperature ranges 506 and/or 508 may be defined based on temperatures at which uncorrectable errors and possible data loss are relatively more likely to occur if data is written to the storage device at that "extreme" temperature range and then read back at the opposite "extreme" temperature range (e.g. data initially written at temperature range 506 and later read back at temperature range 508, and/or data originally written at temperature range 508 and later read back at temperature range 506). As such, the predefined temperature range 504 may be defined based on temperatures at which read errors and possible data loss are relatively less likely to occur when data is originally written within the predefined temperature range 504 and is read back at temperatures within either of the "extreme" temperature ranges 506 and 508. In a specific example, temperature-based data error thresholds may be defined to identify temperatures at which data errors resulting from writes followed by subsequent reads produce data errors that exceed a threshold number, thus defining the first temperature $T_1$ and the second temperature $T_2$.

As will be appreciated by one of skill in the art in possession of the present disclosure, the temperature range 504 for the storage device 206/300 may vary due to the use of different materials in the storage device 206/300, the use of different components in the storage device 206/300, the environment in which the storage device 206/300 is operating, and/or other factors that would be apparent to one of skill in the art in possession of the present disclosure. As such, while a few specific examples of particular temperatures have been provided above, one of skill in the art in possession of the present disclosure will appreciate how different predefined temperature ranges may be utilized for different storage devices while remaining within the scope of the present disclosure as well.

With reference to FIG. 5D, at block 402 and in the specific examples provided below, the write operations 502 are performed at a temperature 510 in the "extreme" temperature range 506. As discussed above, the writing of data to the storage subsystem 308 at the relatively high temperature 510 may result in read errors and possible data loss if that data is read back at a relative low temperature in the "extreme" temperature range 508. However, while a specific example is illustrated in which a write operation has been performed at a temperature in the relatively high temperature range 506, one of skill in the art in possession of the present disclosure will appreciate how the functionality described below may be performed when the write operation is performed at a temperature in the relatively low temperature range 510 while remaining with the scope of the present disclosure as well.

Figure 5E:
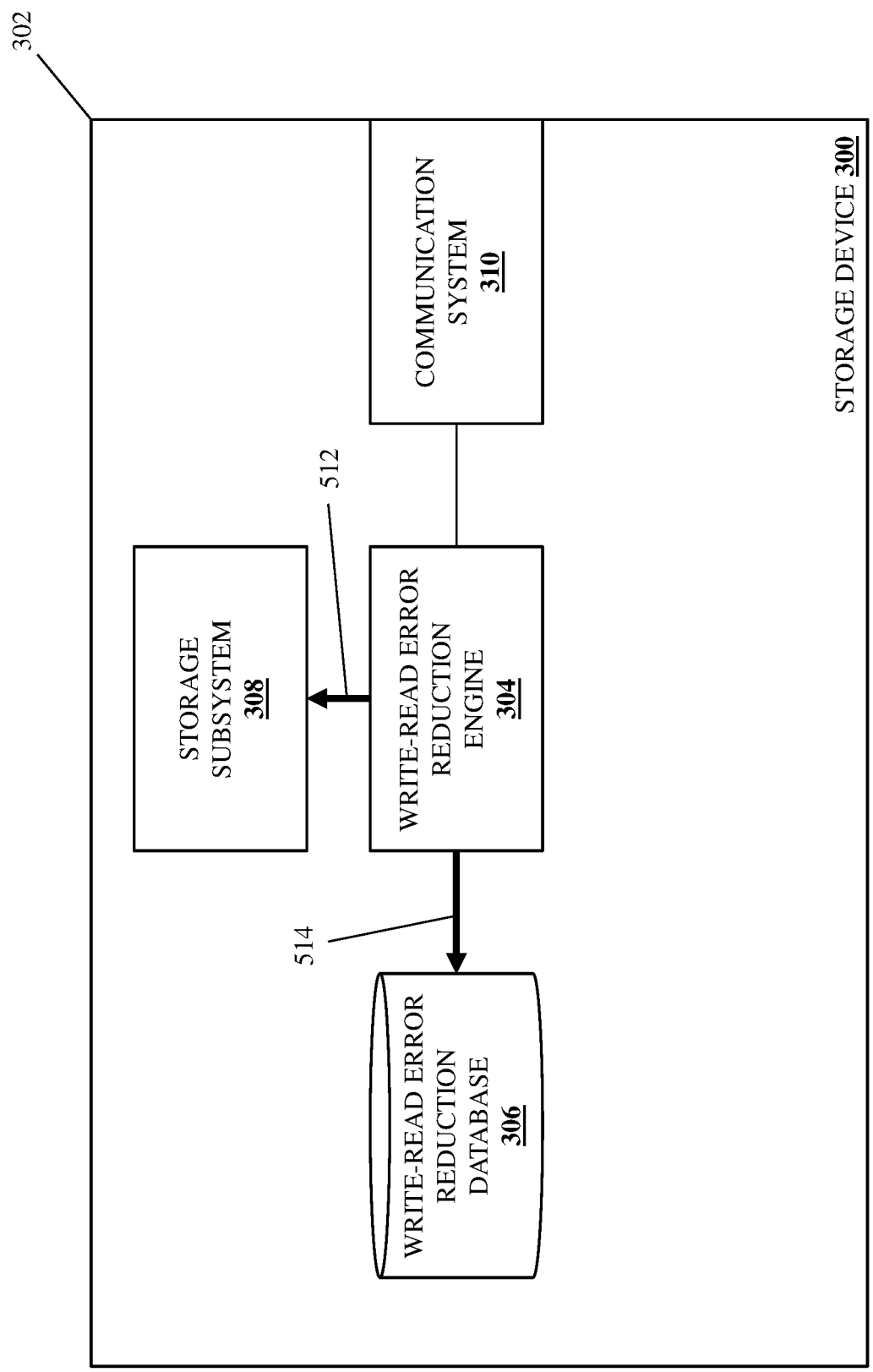
FIG. 5E is a schematic view illustrating an embodiment of the storage device of FIG. 3 operating during the method of FIG. 4.

With reference to FIG. 5E, in an embodiment of block 402, the write-read error reduction engine 304 in the storage device 300 may perform write temperature recording operations that may include recording the temperature at which the data was written to the storage subsystem 308. For example, at block 402, the write-read error reduction engine 304 may perform write temperature recording operations 512 that may include tagging, appending, or otherwise adding write temperature information that identifies the temperature at which the data was written to the storage subsystem 308 to that data (e.g., as metadata) prior to storing that data in the storage subsystem 308, and then storing the data with the write temperature information in the storage subsystem 308.

In another example, at block 402, the write-read error reduction engine 304 may perform write temperature recording operation 514 that may include providing write temperature information that identifies the temperature at which the data was written to the storage subsystem 308, a time at which the data was written to the storage subsystem 308, as well as any other write temperature information that would be apparent to one of skill in the art in possession of the present disclosure, in the write-read error reduction database 306. For example, the write-read error reduction database 306 may provide a write temperature information table in which temperatures at which data is written to the storage subsystem 308 may be stored, and may allow the write-read error reduction engine 304 to provide an identifier for data, a temperature at which that data was written to the storage subsystem 308 in association with that identifier, a time at which the data was written to the storage subsystem 308, and/or any other information that one of skill in the art in possession of the present disclosure would recognize as allowing for the functionality described below. However, while specific examples the recording of temperatures at which data is written to a storage subsystem (as well as other information) have been described, one of skill in the art in possession of the present disclosure will appreciate how write temperature information recording may be performed using a variety of other techniques while remaining within the scope of the present disclosure as well. For example, "tags" or other simple data indicators may be utilized to indicate "extreme" write temperatures (e.g., either hot or cold) while remaining within the scope of the present disclosure as well.

In some embodiments, the write-read error reduction engine 304 in the storage device 300 may be configured to perform cyclical temperature determination operations that may identify a cyclical temperature variation experienced by the storage subsystem 308 and/or storage device 300. In one example, the write temperature information stored in either, or both, of the storage subsystem 308 or the write-read error reduction database 306 may be utilized in such cyclical temperature determination operations. To provide a specific example, the write-read error reduction engine 304 may perform the cyclical temperature determination operations using the data that was stored as part of write temperature recording operations 512 and 514 and that may identify the temperature at which data was written to the storage subsystem 308, the time at which data was written to the storage subsystem 308, as well as other write temperature information that would be apparent to one of skill in the art in possession of the present disclosure.

In another example, the write-read error reduction engine 304 may perform the cyclical temperature determination operations by periodically measuring the temperature of the storage device 206/300 and/or the storage subsystem 308 using a temperature sensor in the storage device 206/300 or in the computing device 200, temperature information accessible via a network, and/or using other temperature determination techniques that would be apparent to one of skill in the art in possession of the present disclosure. The periodic measurements of the temperature of the storage device 206/300 and/or the storage subsystem 308 may then be stored in a cyclical temperature variation database (not illustrated).

The write-read error reduction engine 304 may then analyze the data collected as part of the cyclical temperature determination operations to determine cyclical variation of the temperature of the storage device 206/300 and/or the storage subsystem 308 over time. For example, as will be appreciated by one of skill in the art in possession of the present disclosure, the temperature of the storage device 206/300 and/or the storage subsystem 308 may be cyclical over a daily time period, with the storage device 206/300 and/or the storage subsystem 308 experiencing the relatively high temperatures discussed above in the afternoon, the relatively low temperatures discussed above in the nighttime, and the nominal temperatures discussed above between the afternoon and night. As will be appreciated by one of skill in the art in possession of the present disclosure, in some embodiments the determination of the cyclical temperature variation of the storage device 206/300 and/or the storage subsystem 308 may conserve storage space in the storage device 206/300 by, for example, erasing write temperature information that has already been used to determine that cyclical temperature variation. As discussed in some of the embodiments described below, the cyclical temperature variation of the storage device 206/300 or storage subsystem 308 may be utilized (along with a time data was written to the storage subsystem 308) in order to identify the temperature at which data was written to the storage subsystem 308 (e.g., eliminating the need to store the write temperature information discussed above).

In some embodiments, the cyclical variation of the temperature of storage device 206/300 and/or the storage subsystem 308 may be used to scheduled background operations. As discussed above, cyclical variation of the temperature of storage device 206/300 and/or the storage subsystem 308 may be utilized to determine the time periods when the nominal temperature range discussed above occurs cyclically, and thus the background operations that are discussed below as moving data that was written at extreme (i.e., relatively high or relatively low) temperatures may be scheduled for those time periods. However, while specific examples of determining cyclical temperature variations of the storage device 206/300 and/or the storage subsystem 308 and the use of such cyclical temperature variations have been described, one of skill in the art in possession of the present disclosure will appreciate how other techniques for determining and using cyclical temperature variations of a storage device and/or a storage subsystem will fall within the scope of the present disclosure.

The method 400 then proceeds to decision block 404 where it is determined whether a storage device background operation should be performed. In an embodiment, at decision block 404, the write-read error reduction engine 304 in the storage device 206/300 may determine if a background operation instruction has been received from the host/computing engine 204, if a background operation has been scheduled by the storage device internally, and/or if a background operation will otherwise be performed. For example, the computing engine 204 may instruct the performance of a current background operation (or instruct a previously delayed background operation) in anticipation of a particularly large workload (i.e., that will require all available flash blocks for relatively high performance). In some examples, in response to either receiving an instruction to perform the background operation from a host/computing engine 204 or determining a background operation has been scheduled internally, the write-read error reduction engine 304 may determine if there is sufficient time, processor/computing resources, memory resources and/or whether other requirements are satisfied for carrying out storage device background operations. However, while specific examples of determining if a background operation should be performed have been described, one of skill in the art in possession of the present disclosure will appreciate that other techniques for determining if a background operation should be performed by a storage device will fall within the scope of the present disclosure.

If, at decision block 404, it is determined that the storage device background operation should not be performed, the method 400 returns to decision block 404. In an embodiment, at decision block 404, the write-read error reduction engine 304 in the storage device 206/300 may determine that no instruction to perform a background operation has been received from the host/computing engine 204, that no background operation has been scheduled internally in the storage device 206/300, that a write operation from the host/computing engine 204 is in progress and preventing the storage device 206/300 from performing the background operation, that all background operations have been completed no new background operations are currently scheduled, and/or other criteria for not scheduling background operations that would be apparent to one of skill in the art in possession of the present disclosure. As such, the method 400 may loop through decision block 404 until it is determined that the storage device background operation should be performed.

If, at decision block 404, it is determined that the storage device background operation should be performed, the method 400 proceeds to decision block 406 where it is determined whether the storage device temperature is within a predefined temperature range. In an embodiment of decision block 406, the write-read error reduction engine 304 in the storage device 206/300 may determine whether a temperature of the storage device 206/300 and/or the storage subsystem 308 is within the predetermined temperature range 504 discussed above with reference to FIG. 5C (i.e., whether the temperature of the storage device 206/300 and/or the storage subsystem 308 is between $T_1$ and $T_2$). For example, the write-read error reduction engine 304 may retrieve temperature information from a temperature sensor in the storage device 206/300 (not illustrated), temperature information from a temperature sensor in the computing device 200 (not illustrated), temperature information accessible via a network, and/or may determine the temperature of the storage device 206/300 and/or the storage subsystem 308 using other temperature determination techniques that would be apparent to one of skill in the art in possession of the present disclosure. The write-read error reduction engine 304 may then compare the temperature of the storage device 206/300 and/or the storage subsystem 308 to the predetermined temperature range 504 and determine whether that temperature is within the predefined temperature range 504.

In another embodiment, the write-read error reduction engine 304 may utilize the cyclical temperature variation determined for the storage device 206/300 and/or storage subsystem 308 along with a current time to determine whether the temperature of the storage device 206/300 and/or the storage subsystem 308 is within the predetermined temperature range 504. However, while a few specific examples of determining whether a temperature is within a predefined temperature range have been described, one of skill in the art in possession of the present disclosure will appreciate how other techniques for determining whether a temperature is within a predefined temperature range will fall within the scope of the present disclosure as well.

If, at decision block 406, it is determined that the temperature of the storage device 206/300 and/or the storage subsystem 308 is not within the predefined temperature range (i.e., the temperature of the storage device 206/300 and/or the storage subsystem 308 is between $T_{MIN}$ and $T_1$, or between $T_2$ and $T_{MAX}$), the method 400 proceeds to block 408 where the storage device performs background operations. In an embodiment of block 408, the write-read error reduction engine 304 may perform background operations that may include garbage collection (e.g., coalescing the data stored in partially used flash memory blocks into new flash memory block(s) in order to allow the partially used flash memory blocks to be erased), background media scans (e.g., identifying relatively "weak" flash memory blocks which need to be refreshed or re-written), wear leveling (e.g., static wear leveling that includes moving relatively stagnant data in flash memory blocks with relatively low erase counts to blocks with relatively higher erase counts), and/or other background operations that would be apparent to one of skill in the art in possession of the present disclosure.

As discussed above, the writing of data outside of the predefined temperature range (e.g., as part of the background operations performed at block 408) can result in subsequent read errors and possible data loss when the data is read over a threshold temperature difference from the temperature at which it was written, particularly when data written to the storage subsystem 308 at a temperature within one of the relatively extreme temperature ranges (e.g., between TARN and $T_1$, or between $T_2$ and $T_{MAX}$) and read back from the storage subsystem 308 at a temperature within the other relatively extreme temperature range. However, one of skill in the art in possession of the present disclosure will appreciate how some background operations may require immediate performance (e.g., garbage collection operations used to free up space to perform a write operation), and thus may be performed at block 408 despite the issues discussed above.

As will be appreciated by one of skill in the art in possession of the present disclosure, the cyclical temperature variation determined for the storage device 206/300 as discussed above may be utilized for such background operations that are instructed at a temperature that is outside the predefined temperature range (e.g., via the information included therein that allows for a determination of when temperatures within the predefined temperature range will next be experienced). In some embodiments, background operations performed at temperatures outside of the predefined temperature range may be configured so as to not increase the amount of data written to the storage subsystem 308 at temperatures outside the predefined temperature range more than necessary by, for example, performing garbage collection on blocks with relatively high amounts of data that was written to the storage subsystem 308 at temperatures that are outside the predefined temperature range.

In other embodiments, the background operations performed at block 408 may delay the writing of data outside of the predefined temperature range in order to prevent the issues discussed above. For example, at block 408 the write-read error reduction engine 304 in the storage device 206/400 may perform partial background operations that may include identifying flash memory blocks that need to be re-written as part of the background operation, and then delaying the re-writing process of that background operation until the storage device is within the predetermined temperature range.

To provide a specific example, a portion of the background media scan operations discussed above may be performed at a temperature outside the predefined temperature range in order to identify blocks for refreshing or rewriting, but the refreshes/rewrites of the data may be delayed until the temperature of the storage device 206/300 and/or storage subsystem 308 is within the predefined temperature range. In another specific example, if errors are encountered during garbage collection operations or wear leveling operations that are being performed at a temperature outside the predefined temperature range, those errors may be added to a refresh table (not shown) for later refreshing/rewriting in the storage subsystem 308 at a temperature within the predefined temperature range. For example, blocks with errors may be left untouched (e.g., not coalesced or moved) but added to the refresh table, with alternate blocks then chosen to continue the required garbage collection and wear leveling operations. As will be appreciated by one of skill in the art in possession of the present disclosure, blocks with errors that prevent their data from being read also prevent the movement or coalescing of that data to a new block, and such blocks may be left untouched in the hopes that their data will be readable when the temperature is more favorable. As will be appreciated by one of skill in the art in possession of the present disclosure, the partial wear leveling operations discussed above may include the write-read error reduction engine 304 determining, while at a temperature that is outside the predefined temperature range, that data in a block has not moved in a relatively long time after its most recent read, and then marking that data (e.g., in the table discussed above) for rewrite as part of the wear leveling operations when the temperature is within the predefined temperature range.

However, while several specific examples have been described for performing partial background operations, one of skill in the art in possession of the present disclosure will appreciate how other techniques for performing partial background operations may be utilized while remaining within the scope of the present disclosure as well. Furthermore, if the write-read error reduction engine 304 in the storage device 206/300 identifies that the temperature of the storage device 206/300 or storage subsystem 308 is "stuck" at a relatively extreme temperature (e.g., a temperature in the "extreme" hot or relatively high temperature range due to, for example, a fan failure), the performance of the partial background operations/delaying of data rewrites as part of the background operations as discussed above may be stopped, and those background operations may be performed in full.

Figure 6A:
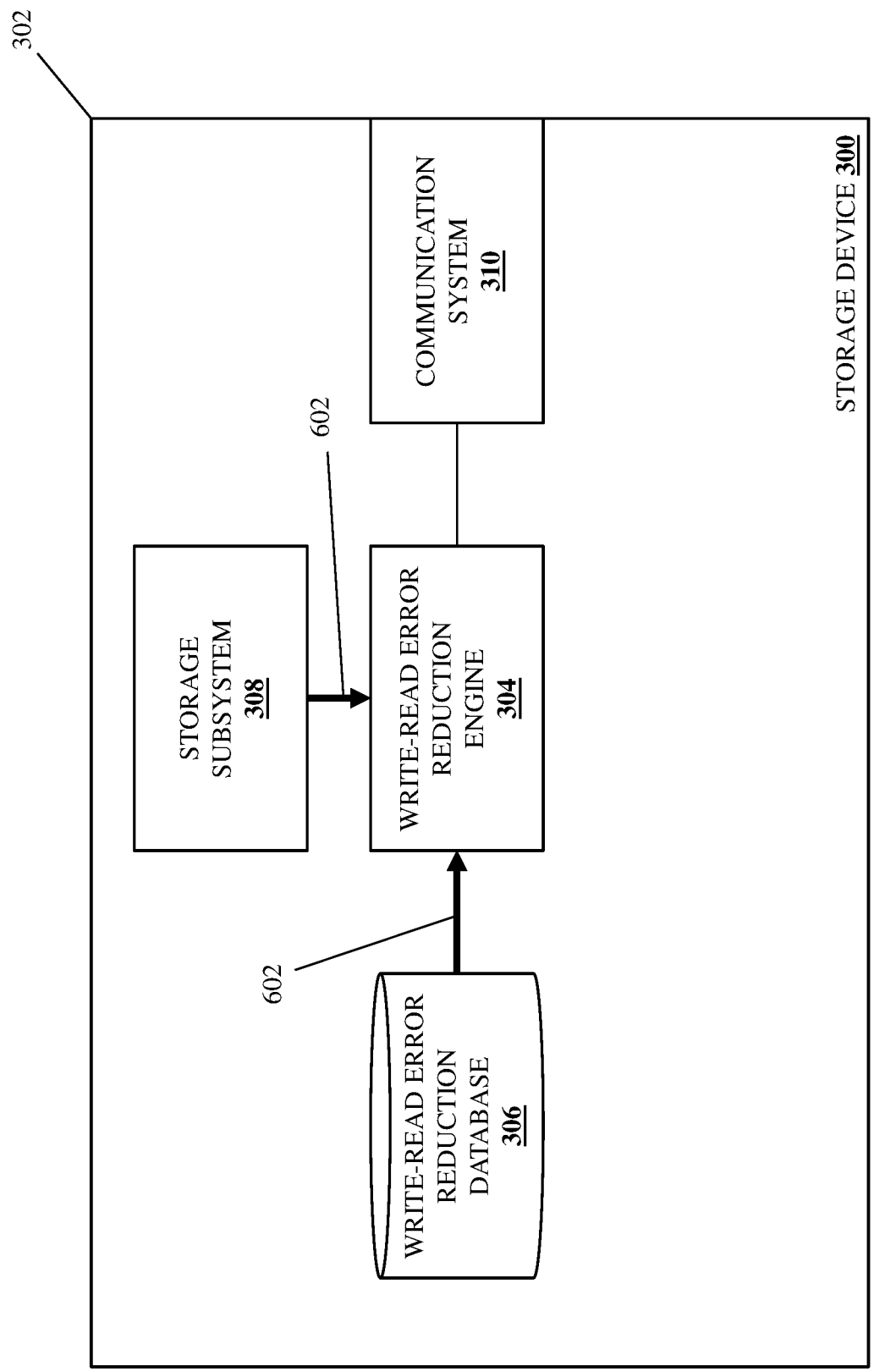
FIG. 6A is a schematic view illustrating an embodiment of the storage device of FIG. 3 operating during the method of FIG. 4.

If, at decision block 406, it is determined that the storage device temperature is within the predefined temperature range, the method 400 proceeds to block 410 where the storage device identifies data written to the storage device outside the predefined temperature range for storage device background operations. With reference to FIG. 6A, in an embodiment of block 410 and in response to determining that the storage device 206/300 and/or storage subsystem 308 are within the predetermined temperature range when background operations should be performed, the write-read error reduction engine 304 in the storage device 206/300 may perform extreme-temperature-write data identification operations 602 using the storage subsystem 308 and/or the write-read error reduction database 306 in order to identify data that was written to the storage subsystem 308 at a temperature outside of the predetermined temperature range 504.

For example, the extreme-temperature-write data identification operations 602 performed by the write-read error reduction engine 304 in the storage device 206/300 may include utilizing the write temperature information stored as part of write temperature recording operations 512 discussed above that included tagging, appending, or otherwise adding write temperature information that identified the temperature at which the data was written to the storage subsystem 308 to that data (e.g., as metadata) prior to storing that data in the storage subsystem 308, and/or the write temperature recording operations 514 that included storing write temperature information that identified the temperature at which the data was written to the storage subsystem 308 in the write-read error reduction database 306. As would be appreciated by one of skill in the art in possession of the present disclosure, the write-read error reduction engine 304 may utilize the write temperature information to determine which data in the storage subsystem 308 was written outside of the predetermined temperature range at either the "extreme hot" or otherwise relatively high temperature (e.g., a temperature range of the storage device between 50 C and 85 C in the specific examples provided above), or the "extreme cold" or relatively low temperature (e.g., a temperature range of the storage device between 0 C and −40 C in the specific examples provided above).

In another example, the write-read error reduction engine 304 in the storage device 206/300 may utilize the cyclical temperature variation that was determined for the storage device 206/300 as discussed above and that identifies the time periods when nominal temperatures (e.g., a temperature range of the storage device between 0 C to 50 C in the specific examples provided above) occur in the storage device 206/300, when the "extreme hot" or otherwise relatively high temperatures (e.g., a temperature range of the storage device between 50 C and 85 C in the specific examples provided above) occur in the storage device 206/300, and when the "extreme cold" or relatively low temperatures (e.g., a temperature range of the storage device between 0 C and −40 C in the specific examples provided above) occur in the storage device 206/300. The write-read error reduction engine 304 may then identify when the data was stored in the storage subsystem 308 to determine if data was written at a time that the cyclical temperature variation indicates that the storage device 206/300 was outside of the predefined temperature range. However, while specific examples have been described above for identifying data written outside of a predetermined temperature range, one of skill in the art in possession of the present disclosure will appreciate how other techniques may be utilized to identify data written outside of a predetermined temperature range while remaining within the scope of the present disclosure as well.

The method 400 then proceeds block 412 where the storage device performs storage device background operations while prioritizing the data written to the storage device outside the predefined temperature range to rewrite that data to the storage device. In an embodiment of block 412, the write-read error reduction engine 304 in the storage device 206/300 may prioritize the data that was identified at block 410 as having been written to the storage subsystem 308 at the relatively cold and/or relatively hot temperatures discussed above for the background operations identified at decision block 404 (i.e., over other data in the storage subsystem 308 that was written to the storage subsystem 308 at a temperature that is within the predefined temperature range 504). For example, for garbage collection operations, the write-read error reduction engine 304 may prioritize blocks that have relatively more data that was written to the storage subsystem 308 at a temperature that was outside the predefined temperature range over blocks that have relatively less data that was written to the storage subsystem 308 at a temperature that was outside the predefined temperature range.

Figure 6B:
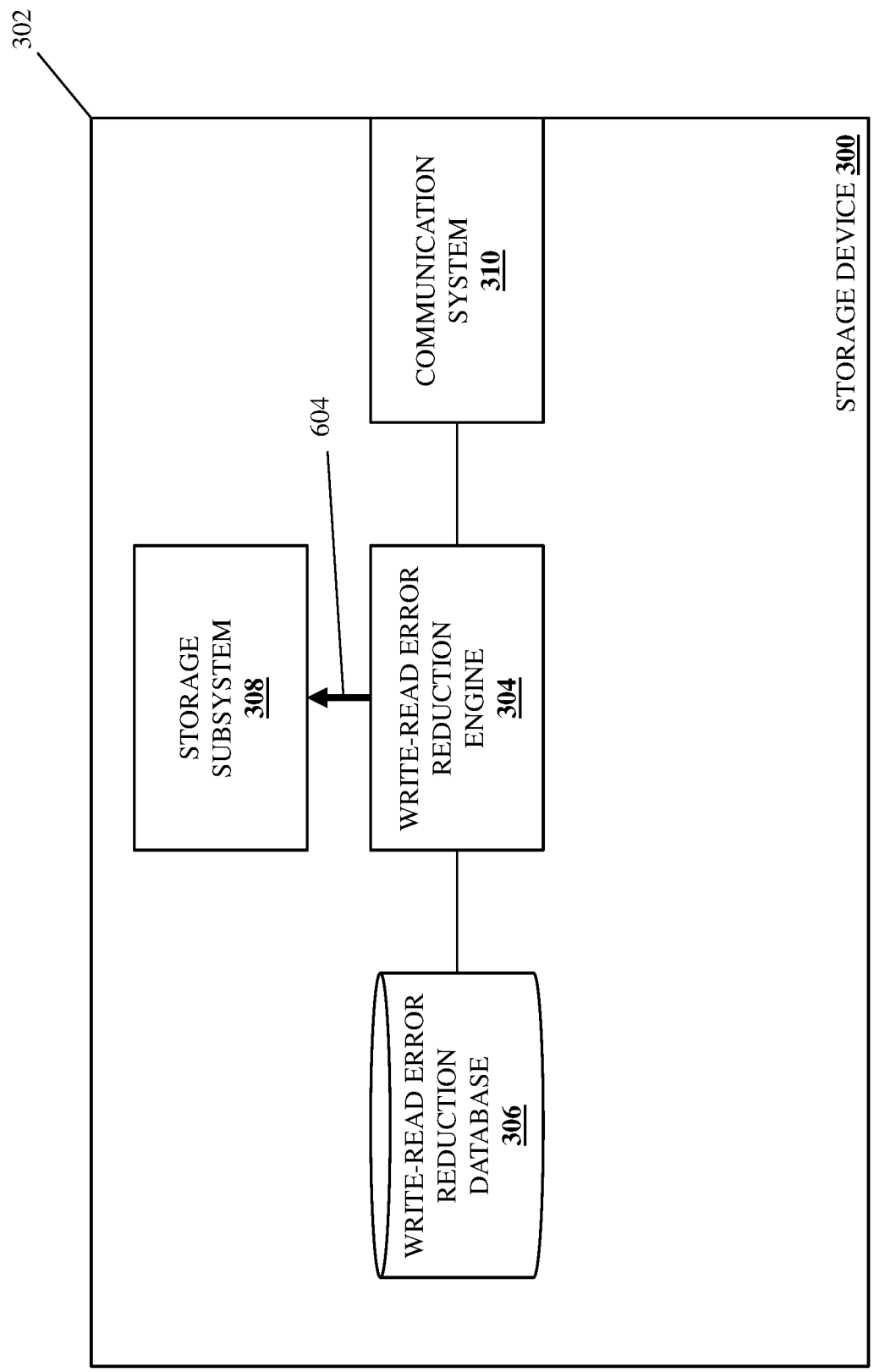
FIG. 6B is a schematic view illustrating an embodiment of the storage device of FIG. 3 operating during the method of FIG. 4.
Figure 6C:
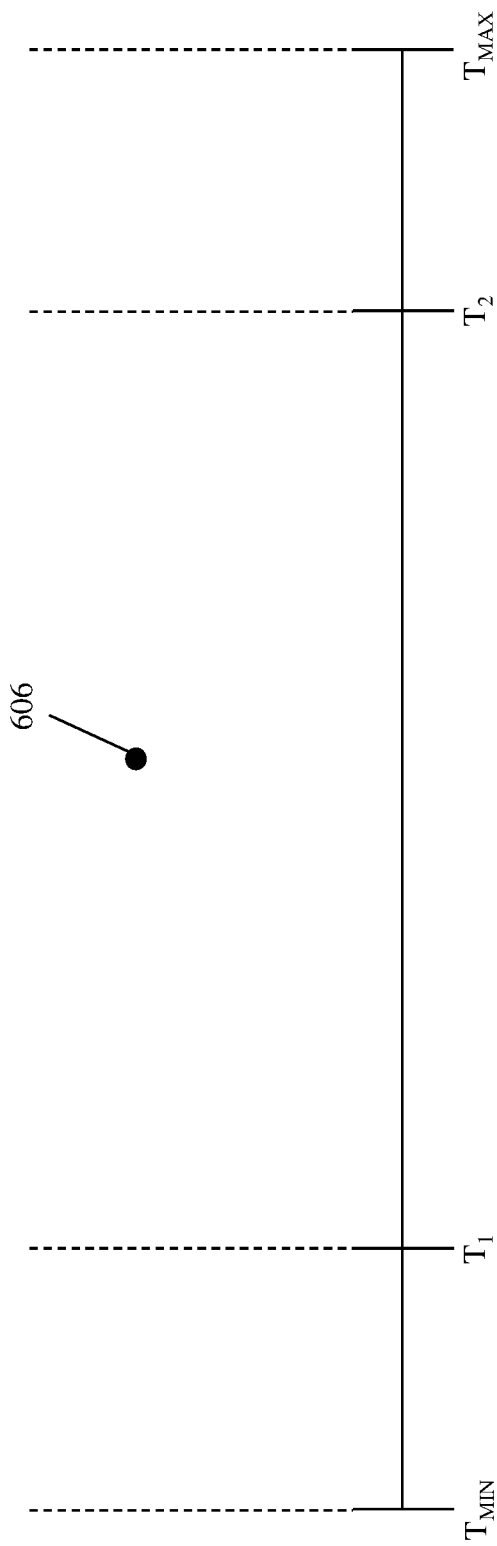
FIG. 6C is a graph view illustrating an embodiment of a rewrite operation performed at a nominal temperature by the storage device of FIG. 3 during the method of FIG. 4.

With reference to FIG. 6B, in an embodiment of block 412, the write-read error reduction engine 304 in the storage device 206/300 may perform background operations 604 using storage subsystem 308. For example, similarly as discussed above, the background operations 604 may include garbage collection, background media scans, wear leveling and/or other background operations that would be apparent to one of skill in the art in possession of the present disclosure, but with those background operations prioritizing the rewriting of data that was previously written to the storage subsystem 308 at a temperature that was outside the predefined temperature range 504. In a specific example, with reference to FIGS. 6B and 6C, the background operations 604 performed by the write-read error reduction engine 304 may include a rewrite of the data (which was written as part of the write operations 502 performed at the temperature 510 as discussed above with reference to FIGS. 5B and 5D) at a temperature 606 that is within the predefined temperature range 504 (e.g., between $T_1$ and $T_2$).

Furthermore, as discussed above, if errors are encountered during garbage collection operations or wear leveling operations that are being performed at a temperature outside the predefined temperature range, those errors may be added to a refresh table (not shown) for later refreshing/rewriting in the storage subsystem 308 at a temperature within the predefined temperature range. As will be appreciated by one of skill in the art in possession of the present disclosure, such errors in the refresh table (even if the associated data was not written to the storage subsystem 308 at an "extreme temperature") may indicate relatively "weak" blocks whose data should be prioritized for rewriting or other data movement in order to ensure data integrity, and doing so at the nominal temperatures within the predefined temperature range may increase the chances of remedying the errors in that data.

As such, the data may be rewritten in the "natural course" of background operations that would have been performed regardless, with those background operations performed at nominal temperatures to automatically rewrite that data. To provide a specific example, such garbage collection operations may include the coalescing of partial blocks that had their data previously written at "extreme temperatures" to rewrite that data to full blocks at nominal temperatures within the predefined temperature range.

Figure 8:
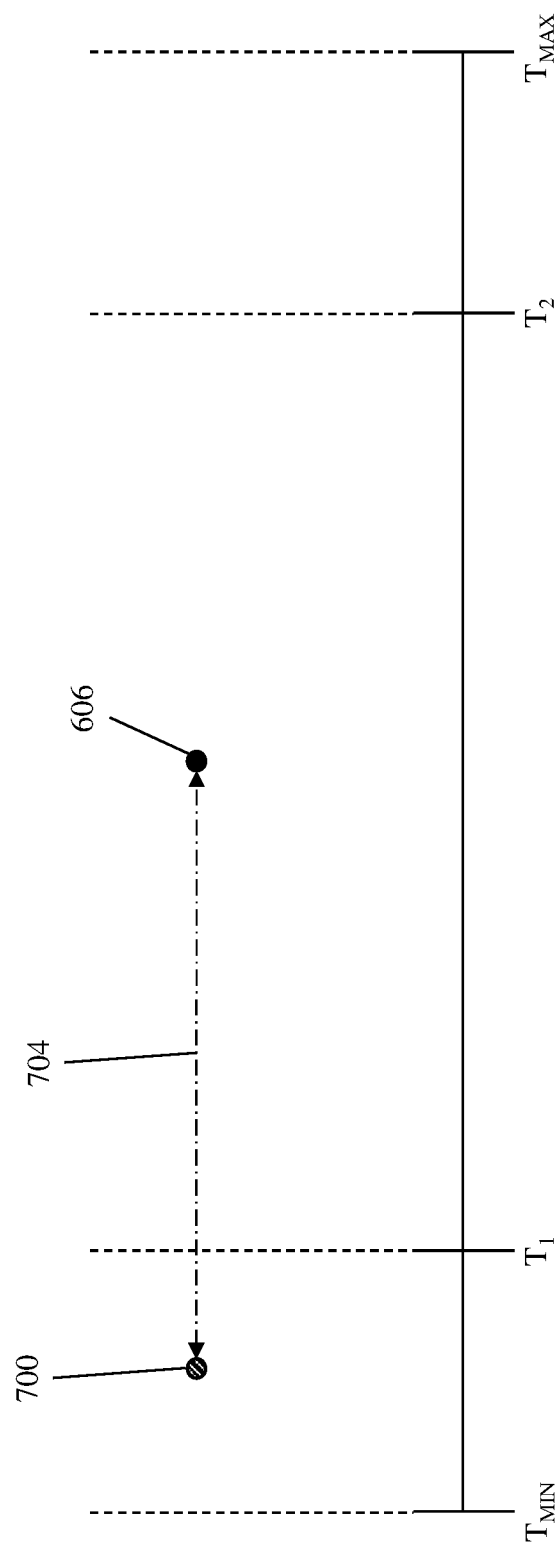
FIG. 8 is a graph view illustrating an embodiment of write-read operations performed by the storage device of FIG. 3 during the method of FIG. 4.

As will be appreciated by one of skill in the art in possession of the present disclosure, the rewriting of the data to the storage subsystem 308 at block 412 and at the temperature 606 that is within the predefined temperature range 504 operates to reduce the worst-case write/read temperature difference that may result upon a subsequent read of that data, thus reducing possible errors and data loss that can occur when reading data at a temperature that differs greatly from the temperature at which it was written. For example, FIG. 7 illustrates how the data discussed above as having been written at the relatively high temperature 510 may be read back at a relatively low temperature 700 to provide a write/read temperature difference 702. Furthermore, FIG. 8 illustrates how the data discussed above as having been rewritten at the relatively nominal temperature 606 may be read back at the relatively low temperature 700 to provide a write/read temperature difference 704 that is much less than the write/read temperature difference 702 and that one of skill in the art in possession of the present disclosure will recognize will result is relatively fewer errors and data loss as compared to the write/read temperature difference 702.

To provide a specific example, background operations may require reading, coalescing, and rewriting of data, and one of skill in the art in possession of the present disclosure will appreciate how those operations will all be performed at the current temperature. As such, the systems and methods of the present disclosure attempt to minimize the performance of such background operations at "extreme" temperatures (e.g., only performing them at "extreme" temperatures when necessary), and then perform as many background operations as possible at nominal temperatures within the predetermined temperature range in order to rewrite as many blocks at those nominal temperature within the predetermined temperature range.

In some embodiments, the write-read error reduction engine 304 in the storage device 206/300 may be configured to not rewrite some data that was written to the storage subsystem 308 at a temperature that is outside the predefined temperature range. For example, the write-read error reduction engine 304 may be configured to identify data that is regularly written to and read from the storage subsystem 308 at a temperature that is outside the predefined temperature range (e.g., data that is written and read regularly in the extreme hot temperature range), and may determine that that data should not be rewritten when the temperature is within the predefined temperature range (e.g., in order to ensure that the write/read temperature difference is minimized for that data). Furthermore, while the method 400 is discussed above as including the recording of the temperature at which data is written to the storage subsystem 308 and the prioritizing of the data that was written at temperatures that are outside the predefined temperature range for use in the background operations, one of skill in the art in possession of the present disclosure will appreciate how at least some of the benefits of the present disclosure may be realized by simply performing at least the rewrite portion of any background operations within the predefined temperature range (i.e., without the need to record write temperature information and prioritize data written at temperatures within particular temperature ranges).

Thus, systems and methods have been described that provide an SSD storage device that prioritizes data that was written to the SSD storage device at an extreme temperature (i.e., either a relatively high or relatively low temperature) for use in background operations performed at a predetermined/nominal temperature range in order to rewrite that data in the SSD storage device at a temperature within the predetermined/nominal temperature range. For example, the write-read error reduction system of the present disclosure may include an SSD storage device. The SSD storage device determines, at a temperature that is within a predefined temperature range, that a storage device background operation should be performed and, in response, identifies data that is stored in the storage device and that was written to the storage device outside the predefined temperature range. The SSD storage device then prioritizes the data that was written to the SSD storage device outside the predefined temperature range over data that was written to the SSD storage device within the predefined temperature range and, based on that prioritization, performs the storage device background operation to rewrite the data to the SSD storage device. As such, SSD storage devices operating in wide temperature environments may utilize background operations that rewrite data, which was written at relatively hot and/or relatively cold temperatures, at nominal temperatures to reduce the occurrence of errors and possible data loss that may otherwise occur when data is written and then read back over a relatively large temperature range.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A storage device write-read error reduction system, comprising:
   a computing device; and
   a storage device that is included in the computing device and that is configured to:
      identify a cyclical temperature variation of the storage device;
      write, at a second temperature that is outside a predefined temperature range and based on the cyclical temperature variation indicating that a first temperature that is within the predefined temperature range will follow the second temperature within a threshold time period, first data to the storage device;
      determine, at the first temperature and subsequent to writing the first data to the storage device, that a storage device background operation should be performed;
      identify, in response to determining that the storage device background operation should be performed, the first data that is stored in the storage device and that was written to the storage device outside the predefined temperature range;
      prioritize, based on the first data having been written to the storage device outside the predefined temperature range, the first data for rewriting during storage device background operations over second data that is stored in the storage device and that was written to the storage device within the predefined temperature range; and
      perform, based on the prioritizing the first data over the second data, the storage device background operation to rewrite the first data to the storage device.

2. The system of claim 1, wherein the storage device is configured to:
   identify, in response to determining that the storage device background operation should be performed, third data that is stored in the storage device and that was written to the storage device outside the predefined temperature range;

determine that the third data will be subsequently read from the storage device outside the predefined temperature range; and prevent, in response to determining that the third data will be subsequently read from the storage device outside the predefined temperature range, rewriting of the third data to the storage device.

3. The system of claim 1, wherein the storage device is configured to:
store, in association with the first data, the second temperature at which the first data was written to the storage device.

4. The system of claim 3, wherein the storing of the second temperature in association with the first data includes providing the second temperature as metadata in the first data that is written to the storage device.

5. The system of claim 1, wherein the storage device background operation includes one of media scan operations, garbage collection operations, or wear leveling operations.

6. The system of claim 1, wherein the storage device is configured to:
determine, at a plurality of different times, a temperature of the storage device;
store the temperatures determined at the plurality of different times in the storage device; and
determine, using the temperatures determined at the plurality of different times that are stored in the storage device, the cyclical temperature variation of the storage device.

7. An Information Handling System (IHS), comprising:
a processing system; and
a memory system that is coupled to the processing system and that includes instructions that, when executed by the processing system, cause the processing system to provide a write-read error reduction engine that is configured to:
identify a cyclical temperature variation of a storage subsystem;
write, at a second temperature that is outside a predefined temperature range and based on the cyclical temperature variation indicating that a first temperature that is within the predefined temperature range will follow the second temperature within a threshold time period, first data to the storage subsystem;
determine, at the first temperature and subsequent to writing the first data to the storage device, that the storage subsystem background operation should be performed;
identify, in response to determining that the storage device background operation should be performed, the first data that is stored in the storage subsystem that is coupled to the processing system and that was written to the storage subsystem outside the predefined temperature range;
prioritize, based on the first data having been written to the storage subsystem outside the predefined temperature range, the first data for rewriting during storage device background operations over second data that is stored in the storage subsystem and that was written to the storage subsystem within the predefined temperature range; and
perform, based on the prioritizing the first data over the second data, the storage device background operation to rewrite the first data to the storage subsystem.

8. The IHS of claim 7, wherein the write-read error reduction engine is configured to:

identify, in response to determining that the storage device background operation should be performed, third data that is stored in the storage subsystem and that was written to the storage subsystem outside the predefined temperature range;
determine that the third data will be subsequently read from the storage subsystem outside the predefined temperature range; and
prevent, in response to determining that the third data will be subsequently read from the storage subsystem outside the predefined temperature range, rewriting of the third data to the storage subsystem.

9. The IHS of claim 7, wherein the write-read error reduction engine is configured to:
store, in association with the first data, the second temperature at which the first data was written to the storage subsystem.

10. The IHS of claim 9, wherein the storing of the second temperature in association with the first data includes providing the second temperature as metadata in the first data that is written to the storage subsystem.

11. The IHS of claim 7, wherein the storage device background operation includes one of media scan operations, garbage collection operations, or wear leveling operations.

12. The IHS of claim 7, wherein the write-read error reduction engine is configured to:
determine, at a plurality of different times, a temperature of the storage subsystem;
store the temperatures determined at the plurality of different times in the storage subsystem; and
determine, using the temperatures determined at the plurality of different times that are stored in the storage subsystem, the cyclical temperature variation of the storage device.

13. The IHS of claim 7, wherein the rewriting the first data to the storage subsystem at the first temperature reduces a write-read temperature difference at a subsequent read of the first data that occurs outside the predefined temperature range relative to if the first data was not rewritten.

14. A method for reducing write-read errors in a storage device, comprising:
identifying, by the storage device, a cyclical temperature variation of the storage device;
writing, by the storage device at a second temperature that is outside a predefined temperature range and based on the cyclical temperature variation indicating that a first temperature that is within the predefined temperature range will follow the second temperature within a threshold time period, first data to the storage device;
determining, by the storage device at the first temperature and subsequent to writing the first data to the storage device, that a storage device background operation should be performed;
identifying, by the storage device in response to determining that the storage device background operation should be performed, the first data that is stored in the storage device and that was written to the storage device outside the predefined temperature range;
prioritizing, by the storage device based on the first data having been written to the storage device outside the predefined temperature range, the first data for rewriting during storage device background operations over second data that is stored in the storage device and that was written to the storage device within the predefined temperature range; and performing, by the storage device based on the prioritizing the first data over the second data, the storage device background operation to rewrite the first data to the storage device.

15. The method of claim 14, further comprising:
identifying, by the storage device in response to determining that the storage device background operation should be performed, third data that is stored in the storage device and that was written to the storage device outside the predefined temperature range;
determining, by the storage device, that the third data will be subsequently read from the storage device outside the predefined temperature range; and
preventing, by the storage device in response to determining that the third data will be subsequently read from the storage device outside the predefined temperature range, rewriting of third data to the storage device.

16. The method of claim 14, further comprising:
storing, by the storage device in association with the first data, the second temperature at which the first data was written to the storage device.

17. The method of claim 16, wherein the storing of the second temperature in association with the first data includes providing the second temperature as metadata in the first data that is written to the storage device.

18. The method of claim 14, wherein the storage device background operation includes one of media scan operations, garbage collection operations, or wear leveling operations.

19. The method of claim 14, further comprising:
determining, by the storage device at a plurality of different times, a temperature of the storage device;
storing, by the storage device, the temperatures determined at the plurality of different times in the storage device; and
determining, by the storage device using the temperatures determined at the plurality of different times that are stored in the storage device, the cyclical temperature variation of the storage device.

20. The method of claim 14, wherein the rewriting the first data to the storage device at the first temperature reduces a write-read temperature difference at a subsequent read of the first data that occurs outside the predefined temperature range relative to if the first data was not rewritten.

* * * * *

UNITED STATES PATENT AND TRADEMARK OFFICE
CERTIFICATE OF CORRECTION

| | | |
|---|---|---|
| PATENT NO. | : 12,055,996 B2 | Page 1 of 1 |
| APPLICATION NO. | : 17/973292 | |
| DATED | : August 6, 2024 | |
| INVENTOR(S) | : Allen et al. | |

It is certified that error appears in the above-identified patent and that said Letters Patent is hereby corrected as shown below:

In the Claims

Claim 7, Column 17, Lines 47-49, should read as follows:
--writing the first data to the storage subsystem, that a storage device background operation should be performed;--

Claim 12, Column 18, Line 36, "storage device" should be changed to --storage subsystem--

Claim 15, Column 19, Line 17, "rewriting of third data" should be changed to --rewriting of the third data--

Signed and Sealed this
First Day of October, 2024

Katherine Kelly Vidal
*Director of the United States Patent and Trademark Office*